(12) United States Patent
Engelhardt et al.

(10) Patent No.: US 6,315,913 B1
(45) Date of Patent: Nov. 13, 2001

(54) STRUCTURING METHOD

(75) Inventors: Manfred Engelhardt, Feldkirchen-Westerham; Volker Weinrich, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/146,636

(22) Filed: Sep. 3, 1998

(30) Foreign Application Priority Data

Sep. 3, 1997 (DE) ............................................. 197 38 591

(51) Int. Cl.⁷ ..................................................... B01J 19/10
(52) U.S. Cl. ................................ 216/13; 216/64; 216/67; 216/75; 216/76; 427/560; 438/690
(58) Field of Search ..................... 134/1.1, 1.2; 216/13, 216/37, 41, 57, 64, 67, 75, 76; 204/157.42; 427/560

(56) References Cited

U.S. PATENT DOCUMENTS

| | | | |
|---|---|---|---|
| 4,288,283 | 9/1981 | Umezaki et al. | 156/643 |
| 4,760,481 | 7/1988 | Yuito et al. | 360/123 |
| 4,933,318 | * 6/1990 | Heijman | 505/1 |
| 5,100,476 | 3/1992 | Mase et al. | 134/1 |
| 5,482,566 | 1/1996 | Lee | 134/42 |
| 5,585,300 | 12/1996 | Summerfelt | 437/60 |
| 5,705,443 | 1/1998 | Stauf et al. | 438/722 |
| 5,804,877 | * 9/1998 | Fuller et al. | 257/745 |
| 5,840,200 | * 11/1998 | Nakagawa et al. | 216/6 |
| 6,027,860 | 2/2000 | McClure et al. | 430/314 |
| 6,087,265 | 7/2000 | Hwang | 438/706 |

FOREIGN PATENT DOCUMENTS

| | | |
|---|---|---|
| 0 390 134 A2 | 10/1990 | (EP) . |
| 0 723 205 A1 | 7/1996 | (EP) . |
| 0 788 143 A2 | 8/1997 | (EP) . |
| 54-18973 | 1/1977 | (JP) . |

OTHER PUBLICATIONS

P.L. Pai et al., "Metal Corrosion in Wet Resist–Stripping Process" Proceedings K.T.I. Conference, pp137–148, Dec. 1989.*
Tabara, WSi2/Polysilicon Gate Etching Using TiN Hard Mask in Conjunction with Photoresist, Jpn. J. Appl. Phys. vol. 36 pp 2508–2513, Apr. 1997.*
Japanese Patent Abstract No. 09172076 (Suzuki), dated Jun. 30, 1997.
Patent Abstracts of Japan No. 4–107281 A (Kinoshita), dated Apr. 8, 1992.
Patent Abstracts of Japan No. 1–232729 A (Sakota), dated Sep. 18, 1989.
Patent Abstracts of Japan No. 09–047733.
Derwent Abstract, Semiconductor International, Feb. 1992, vol. 15, No. 2, pp. 58–64.

* cited by examiner

Primary Examiner—Randy Gulakowski
Assistant Examiner—Allan Olsen
(74) Attorney, Agent, or Firm—Herbert L. Lerner; Laurence A. Greenberg; Werner H. Stemer

(57) ABSTRACT

A method for structuring at least one layer to be structured. Initially, a mask is applied to the layer and the layer is structured using the mask. After the structuring step, the mask is then removed, while leaving behind redepositions of the material of the layer. The redepositions of the material of the layer are then removed by sound action.

37 Claims, 2 Drawing Sheets

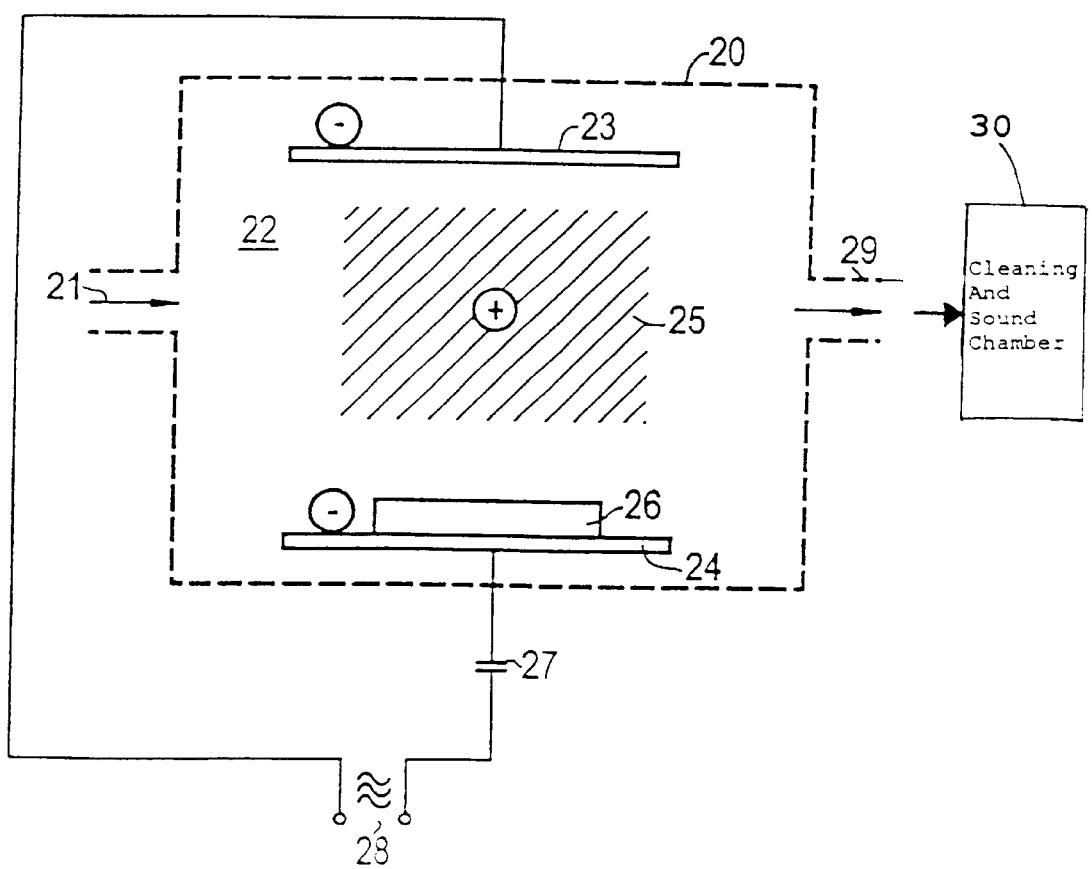

STRUCTURING METHOD

BACKGROUND OF THE INVENTION

Field of the Invention

The present invention relates to a structuring method, in particular a method for structuring layers which can only be etched with difficulty by plasma-chemical or by dry-chemical methods or cannot be etched at all. Such layers are generally composed of inert metals, ferroelectric materials and dielectric materials with a high relative dielectric constant.

During the development of highly integrated memory modules, such as DRAMs and FRAMs, for example, the cell capacity during the progressive miniaturization should be retained or even improved. In order to achieve this object, ever thinner dielectric layers and folded capacitor electrodes (trench cell, stack cell) are used. Instead of using conventional silicon oxide, new materials, in particular paraelectrics and ferroelectrics, are used between the capacitor electrodes of a memory cell. For example, barium strontium titanate (BST, $(Ba,Sr)TiO_3$), lead zirconate titanate (PZT, $Pb(Zr,Ti)O_3$) and/or lanthanum-doped lead zirconate titanate or strontium bismuth tantalate (SBT, $SrBi_2Ta_2O_9$) are used for the capacitors of the memory cells in the DRAMs and/or FRAMs.

There, the materials are usually deposited on existing electrodes (bottom electrodes). Processing takes place at high temperatures, with the result that the materials from which the capacitor electrodes are normally composed of, for example doped polysilicon, are easily oxidized and lose their electrically conductive properties, which can lead to memory cell failure.

Because of their good resistance to oxidation and/or because of the formation of electrically conductive oxides, 4d and 5d transition metals, in particular platinum metals (Ru, Rh, Pd, Os, Ir, Pt) and in particular platinum, and also rhenium are promising candidates which could replace doped polysilicon as the electrode material in the above-mentioned memory cells.

The progressive miniaturization of the components also has the result that replacement materials for the aluminium commonly used for the conductor tracks also became necessary. The replacement material here should have a lower specific resistance and a lower degree of electromigration than aluminium. A promising candidate here is copper. Furthermore, the development of magnetic "Random Access Memories" (MRAMs) requires the integration of magnetic layers (for example Fe, Co, Ni or permalloy) into microelectronic circuits.

In order to be able to construct an integrated circuit from the above-mentioned materials, which have hitherto not been widespread in semiconductor technology, thin layers of these materials must be structured.

The structuring of the previously used materials is carried out as a rule by so-called plasma-supported anisotropic etching methods. Here, physical-chemical methods are usually applied in which gas mixtures composed of one or more reactive gases, such as oxygen, chlorine, bromine, hydrogen chloride, hydrogen bromide and/or halogenated hydrocarbons and of inert gases (for example Ar, He). The gas mixtures are as a rule excited in an alternating electromagnetic field at low pressures.

The principles of the method of operation of an etching chamber, are illustrated by example of a parallel plate reactor. A gas mixture, for example Ar and $Cl_2$, is fed to a reactor chamber via a gas inlet and pumped out again through a gas outlet. A lower plate of the parallel plate reactor is connected to a high-frequency source by a capacitor and serves as a substrate holder. By applying a high-frequency alternating electric field to an upper plate and the lower plate of the parallel-plate reactor, the gas mixture is converted into a plasma. Since the mobility of the electrons is greater than that of the gas cations, the upper and lower plates become negatively charged with respect to the plasma. For this reason, both plates exert a high force of attraction on the positively charged gas cations, with the result that they are subjected to a permanent bombardment by the ions, for example $Ar^+$. Since the gas pressure is kept low, typically 0.1–10 Pa, there is only a low degree of scattering of the ions with respect to one another and to the neutral particles, and the ions strike virtually perpendicular against the surface of a substrate which is secured to the lower plate of the parallel-plate reactor. This permits an image of a mask to be well formed on the underlying layer of the substrate to be etched.

Usually, photoresists are used as mask materials since they can be structured relatively simply by an exposure step and a development step.

The physical part of the etching is brought about by the impetus and kinetic energy of the incident ions (for example $Cl_2+$, $Ar+$). In addition, chemical reactions between the substrate and the reactive gas particles (ions, molecules, atoms, radicals) are initiated or promoted (chemical part of the etching) thereby, accompanied by the formation of volatile reaction products. The chemical reactions between the substrate particles and the gas particles are responsible for high etching selectivities of the etching process.

Unfortunately, it has become apparent that the above-mentioned materials, which have newly been brought into use in integrated circuits, are among those materials which cannot be etched or can be etched chemically only with difficulty and in which the etching erosion is based, even when "reactive" gases are used, predominantly or almost exclusively on the physical component of the etching.

Because the chemical component of the etching is small or absent, the etching erosion of the layer to be structured is of the same order of magnitude as the etching erosion of the mask and/or of the substrate (etching barrier layer), i.e. the etching selectivity with respect to the etching mask and/or substrate is generally small (between approximately 0.3 and 3.0). The result of this is that due to the erosion of masks with inclined edges and the unavoidable formation of facets (beveling, tapering) on the masks only a low degree of dimensional accuracy of the structuring can be ensured. The faceting thus restricts the smallest structure sizes which can be achieved during the structuring and the achievable steepness of the profile edges on the layers to be structured.

At the same time, the faceting on the masks, and thus also the faceting of the layers to be structured, is greater the greater the proportion of reactive gases (in particular chlorine) in the gas mixture which is used during the plasma-chemical etching method. Correspondingly, gas mixtures which do not have any proportion of reactive gases, for example pure argon plasmas, can be used to produce the steepest profile edges on the layers to be structured.

In addition to the aforesaid faceting of the layers to be structured, undesired redepositions of the material of the layer to be structured may also occur during the structuring. Redeposition, as used herein in the context of physical plasma etching, corresponds to the generally accepted usage of the term in the semiconductor industry. See, i.e., U.S. Pat.

No. 6,027,860 to McClure et al. The redepositions occur, for example, on the side walls of the resist mask and to date it has only been possible to remove them incompletely, if at all, in the subsequent post-treatment steps. Unfortunately the occurrence of the redepositions becomes all the more pronounced the smaller the proportion of reactive gases in the gas mixture which is used during the plasma-chemical etching method. Correspondingly, the process control has hitherto usually been limited to small argon proportions, for example in a chlorine/argon plasma. However, the increased proportion of chlorine in the etching gas mixture leads in turn to an increased formation of facets in the masks.

In the case of platinum etching with a resist mask, the use of reactive gases such as chlorine or HBr results in intermediate redepositions forming which disappear again during the further course of the etching. These structures also lead to CD widening and to flat platinum edges. They have been found to be the greatest disadvantage of a process which uses both chlorine and a resist mask.

If, instead of a resist mask, a so-called "hard mask" is used to structure the layers, many of the aforesaid difficulties can be significantly reduced. However, the structuring of a "hard mask" requires additional process steps which make the entire process more expensive.

SUMMARY OF THE INVENTION

It is accordingly an object of the invention to provide a structuring method which overcomes the above-mentioned disadvantages of the prior art methods of this general type.

With the foregoing and other objects in view there is provided, in accordance with the invention, a structuring method, which includes: providing at least one layer to be structured; applying a mask to the at least one layer; structuring the at least one layer using the mask; removing the mask while leaving behind redepositions of material of the at least one layer; and removing the redepositions of the material of the at least one layer utilizing sound action.

It has become apparent that under the action of sound the redepositions of the material of the layer to be structured, which could be removed with the customary chemical methods only with difficulty, can be removed relatively easily and reliably without the structures already produced on the wafer being damaged or destroyed. The method according to the invention thus has the advantage that the methods used for the structuring of the layer to be structured, for example a plasma-chemical etching method, can be selected without regard to the question as to whether these methods lead to increased redepositions. Thus, for example, plasma-chemical etching methods with pure argon plasmas can be used. The result of this is that even conventional resist masks can now be used without the excessive formation of facets on the masks, as is the case when reactive gases are used.

With the foregoing and other objects in view there is also provided, in accordance with the invention, a structuring method, which includes: providing at least one layer to be structured; applying a mask to the at least one layer; structuring the at least one layer using the mask; and removing the mask and redepositions of a material of the at least one layer utilizing sound action.

As a result of the simultaneous removal of the mask and of the redepositions it is possible to save one process step. This gives rise to an overall simpler and cheaper process control. If the mask is a resist mask, preferred media for the combined removal of the resist and the redepositions are: EKC 265, Stripper 106, N-methylpyrrolidone (NMP), Caro's acid, so-called "fuming nitric acid" or KOH.

Preferably the action of sound is carried out by a fluid medium, in particular by an ultrasonic bath, by a megasonic system or by a fluid jet to which sound is applied.

Preferably, after the removal of the redepositions, "scrubber" cleaning is carried out. In addition, or alternatively, wet-chemical cleaning, in particular supported by a further application of sound (ultrasonic, finesonic), can also be carried out after the removal of the redepositions.

Preferably, the layer to be structured contains copper, iron, cobalt, nickel, a 4d or 5d transition metal, in particular a platinum metal.

Furthermore, it is preferred if the layer to be structured contains a ferroelectric material, a dielectric material with a high relative dielectric constant (>20), a perovskite or precursors of these materials. Here, a precursor of the aforesaid materials should be understood to be a material which can be converted into the aforesaid materials by a suitable heat treatment (for example annealing), if appropriate with the addition of oxygen.

Thus, it is preferred if the layer to be structured contains strontium bismuth tantalate (SBT, $SrBi_2Ta_2O_9$), strontium bismuth niobate tantalate (SBNT, $SrBi_2Ta_{2-x}Nb_xO_9$, x=0–2), lead zirconate titanate (PZT, $Pb(Zr,Ti)O_3$) or derivatives and barium strontium titanate (BST, $Ba_xSr_{1-x}TiO_3$, x=0–1), lead lanthanum titanate (PLT, $(Pb, La)TiO_3$), lead lanthanum zirconate titanate (PLZT, $(Pb, La)(Zr, Ti)O_3$) or derivatives.

Furthermore, it is preferred if the layer to be structured contains platinum, gold, silver, copper, iridium, palladium, ruthenium, rhenium or their oxides.

Preferably, a dry etching method, in particular a plasma etching method is used for structuring the layer to be structured.

Here, it is, in particular, preferred if during the dry etching of the layer to be structured a gas mixture is provided which is free of reactive gases.

Furthermore, it is preferred if during the dry etching of the layer to be structured a inert gas, in particular argon, is provided.

Moreover, it is preferred if the sound frequency of the sound used is varied over a predetermined frequency range. Thus, redepositions with different dimensions can also be effectively removed.

In accordance with an added feature of the invention, there is the step of applying a resist mask as the mask and removing the resist mask by burning off the resist mask.

In accordance with an additional feature of the invention, there is the step of dry etching the at least one layer with a gas mixture including only inert gases, nitrogen and oxygen during the structuring step.

In accordance with another feature of the invention, there is the step of forming the mask from a material selected from the group consisting of silicon, a silicon oxide including silicon dioxide, a metal including aluminum and tungsten, a metal nitride including a titanium nitride, and a metal silicide.

In accordance with a concomitant feature of the invention, there is the step of forming the mask from $TiN_x$ where $0.8<x<1.2$.

Other features which are considered as characteristic for the invention are set forth in the appended claims.

Although the invention is illustrated and described herein as embodied in a structuring method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a diagrammatic illustration of an etching chamber in a form of a parallel plate reactor.

DESCRIPTION OF THE PREFERRED EMBODIMENTS

Figure 1:
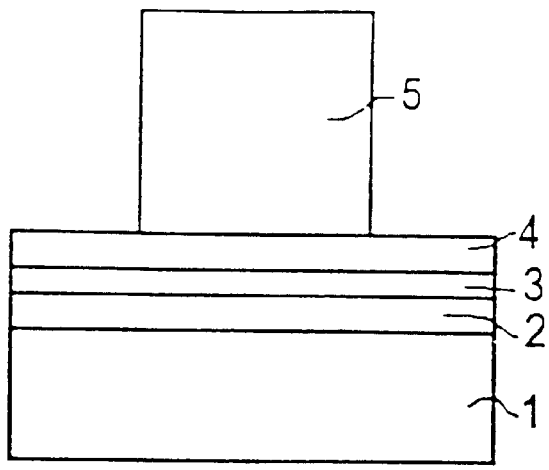
FIGS. 1–3 are front elevational views illustrating a structuring method according to the invention.

Referring now to the figures of the drawing in detail and first, particularly, to FIG. 4 thereof, there are shown the principles of the method of operation of an etching chamber, illustrated as an example by a parallel plate reactor 20. A gas mixture, for example Ar and $Cl_2$, is fed to a reactor chamber 22 via a gas inlet 21 and pumped out again through a gas outlet 29. A lower plate 24 of the parallel plate reactor 20 is connected to a high-frequency source 28 by a capacitor 27 and serves as a substrate holder. By applying a high-frequency alternating electric field to an upper plate 23 and the lower plate 24 of the parallel-plate reactor 20, the gas mixture is converted into a plasma 25. Since the mobility of electrons is greater than that of gas cations, the upper and the lower plates 23, 24 become negatively charged with respect to the plasma 25. For this reason, both plates 23, 24 exert a high force of attraction on the positively charged gas cations, with the result that they are subjected to a permanent bombardment by these ions, for example $Ar^+$. Since the gas pressure is kept low, typically 0.1–10 Pa, there is only a low degree of scattering of the ions with respect to one another and to the neutral particles, and the ions strike virtually perpendicular against the surface of a substrate 26 which is secured to the lower plate 24 of the parallel-plate reactor 20. This permits an image of a mask (not shown) to be well formed on the underlying layer of the substrate 26 to be ectched.

Figure 2:
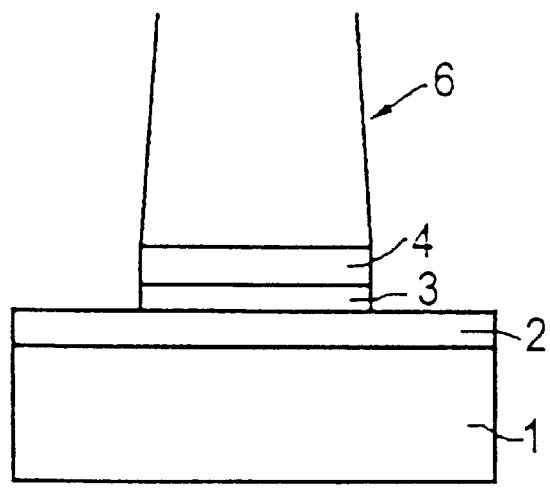
Figure 3:
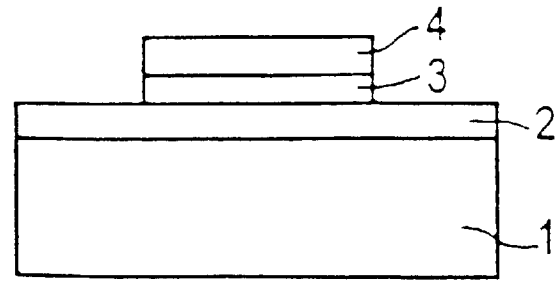

FIGS. 1 to 3 illustrates the method according to the invention. An $Sio_2$ layer 2 is applied to a substrate 1. A barrier layer 3, which is composed of titanium and/or titanium nitride, follows. A platinum layer 4, as a layer to be structured, is applied, for example by sputtering, to the barrier layer 3. A resist layer 5, which serves later as a mask 5 for structuring the platinum layer 4, is formed on the platinum layer 4. The resist layer 5 is structured by an exposure step and a development step. The resulting structure is shown in FIG. 1.

Ion etching or sputter etching is then carried out in order to subject the platinum layer 4 to physical dry etching. The etching gas used here is a pure argon gas. Instead of ion etching, other plasma etchings, such as reactive ion etching (RIE), magnetically enhanced reactive ion etching (MERIE), ECR (Electron Cyclotron Resonance) etching or inductively coupled plasma etching methods (ICP, TCP), for example, can also be used.

Since pure argon can be used as the etching gas, pronounced faceting of the mask 5 does not occur. Correspondingly, the erosion of the mask 5 is also low. As a result of the smaller degree of mask erosion, a relatively higher degree of dimensional accuracy of the structuring is obtained. Moreover, steeper etching edges on the layer to be structured can thus be achieved. Etching edges with an edge angle of over 80° can be produced.

As a result of the absence of a chemical component, redepositions 6 of platinum on side walls of the resist mask 5 occur during the dry etching process. To date the platinum redepositions 6 could be removed with difficulty, if at all, using customary chemical methods.

In order to remove the resist mask 5, the resist is burnt off. Here, exposed platinum redepositions 6 remain on the surface of the platinum layer 4. The resulting structure is shown in FIG. 2.

Then, the redepositions 6 are removed using sound action performed in a sound and cleaning chamber 30 (see FIG. 4). An ultrasonic bath (Bandelin Sonorex Super RK 255 H), for example, can be used. For this purpose, the structure shown in FIG. 2 is immersed in a fluid. In the present case, the structure was immersed in the solvent N-methylpyrrolidone (NMP). The solvent here had a temperature of approximately 65° C. Then, ultrasound with a frequency of approximately 35 kHz and a power of 2*320 watts is injected into the fluid. Under the influence of the ultrasound, the redepositions 6 can be removed relatively simply and reliably without the structures already produced on the wafer being damaged or destroyed.

"Scrubber" cleaning follows. In addition, or alternatively, after the removal of the redepositions 6 it is also possible to carry out wet-chemical cleaning, for example with highly dilute hydrofluoric acid, preferably enhanced by the action of sound. This leads to the chemical etching of the $SiO_2$ surface which is exposed between the platinum structures and to a mechanically enhanced removal of particles from these areas. The resulting structure is shown in FIG. 3.

We claim:

1. A structuring method, which comprises:
   providing at least one layer to be structured;
   applying a mask to the at least one layer;
   structuring the at least one layer using the mask;
   removing the mask while leaving behind redepositions of material of the at least one layer; and
   removing the redepositions of the material of the at least one layer utilizing sound action.

2. The method according to claim 1, which comprises applying a resist mask as the mask and removing the resist mask by burning off the resist mask.

3. The method according to claim 1, which comprises providing the sound action by one of an ultrasonic bath, a megasonic system and a fluid jet having sound applied.

4. The method according to claim 1, which comprises performing a "scrubber" cleaning of the at least one layer after completing the removal of the redepositions step.

5. The method according to claim 1, which comprises performing a wet chemical cleaning of the at least one layer after completing the removal of the redepositions step.

6. The method according to claim 4, which comprises reinforcing the "scrubber" cleaning step with a further sound action.

7. The method according to claim 5, which comprises reinforcing the wet chemical cleaning step with a further sound action.

8. The method according to claim 1, which comprises forming the at least one layer from a material selected from the group consisting of copper, iron, cobalt, nickel, a 4d transition metal and a 5d transition metal.

9. The method according to claim 1, which comprises forming the at least one layer from a platinum metal.

10. The method according to claim 1, which comprises forming the at least one layer from a material selected from the group consisting of a ferroelectric material, a dielectric material with a high permittivity, a perovskite and precursors of these materials.

11. The method according to claim 10, which comprises forming the at least one layer from a material selected from the group consisting of strontium bismuth tantalate ($SrBi_2Ta_2O_9$), strontium bismuth niobate tantalate ($SrBi_2Ta_{2-x}Nb_xO_9$, where x=1 to 2), lead zirconate titanate ($Pb(Zr,Ti)O_3$), barium strontium titanate ($Ba_xSr_{1-x}TiO_3$, where x =0 to 1), lead lanthanum titanate (($Pb,La)TiO_3$), and lead lanthanum zirconate titanate (($Pb,La)(Zr,Ti)O_3$).

12. The method according to claim 1, which comprises forming the at least one layer from a material selected from the group consisting of platinum, gold, silver, iridium, palladium, ruthenium, rhenium and their oxides.

13. The method according to claim 1, which comprises dry etching the at least one layer with a gas mixture that is free of reactive gases during the structuring step.

14. The method according to claim 1, which comprises dry etching the at least one layer with a gas mixture including only inert gases, nitrogen and oxygen during the structuring step.

15. The method according to claim 1, which comprises dry etching the at least one layer with an inert gas during the structuring step.

16. The method according to claim 1, which comprises dry etching the at least one layer with argon gas during the structuring step.

17. The method according to claim 1, which comprises forming the mask from a material selected from the group consisting of silicon, a silicon oxide including silicon dioxide, a metal including aluminum and tungsten, a metal nitride including a titanium nitride, and a metal silicide.

18. The method according to claim 1, which comprises forming the mask from $TiN_x$ where $0.8<x<1.2$.

19. The method according to claim 1, which comprises varying a sound frequency of the sound action over a predetermined frequency range.

20. A structuring method, which comprises:
   providing at least one layer to be structured;
   applying a mask to the at least one layer;
   structuring the at least one layer using the mask; and
   removing the mask and redepositions of a material of the at least one layer utilizing sound action.

21. The method according to claim 20, which comprises providing the sound action by one of an ultrasonic bath, a megasonic system and a fluid jet having sound applied.

22. The method according to claim 20, which comprises performing a "scrubber" cleaning of the at least one layer after completing the removal of the redepositions step.

23. The method according to claim 20, which comprises performing a wet chemical cleaning of the at least one layer after completing the removal of the redepositions step.

24. The method according to claim 22, which comprises reinforcing the "scrubber" cleaning step with a further sound action.

25. The method according to claim 23, which comprises reinforcing the wet chemical cleaning step with a further sound action.

26. The method according to claim 20, which comprises forming the at least one layer from a material selected from the group consisting of copper, iron, cobalt, nickel, a 4d transition metal and a 5d transition metal.

27. The method according to claim 20, which comprises forming the at least one layer from a platinum metal.

28. The method according to claim 20, which comprises forming the at least one layer from a material selected from the group consisting of a ferroelectric material, a dielectric material with a high permittivity, a perovskite and precursors of these materials.

29. The method according to claim 28, which comprises forming the at least one layer from a material selected from the group consisting of strontium bismuth tantalate ($SrBi_2Ta_2O_9$), strontium bismuth niobate tantalate ($SrBi_2Ta_{2-x}Nb_xO_9$, where x=1 to 2), lead zirconate titanate ($Pb(Zr,Ti)O_3$), barium strontium titanate ($Ba_xSr_{1-x}TiO_3$, where x =0 to 1), and lead lanthanum titanate (($Pb,La)TiO_3$), and lead lanthanum zirconate titanate (($Pb,La)(Zr,Ti)O_3$).

30. The method according to claim 20, which comprises forming the at least one layer from a material selected from the group consisting of platinum, gold, silver, iridium, palladium, ruthenium, rhenium and their oxides.

31. The method according to claim 20, which comprises dry etching the at least one layer with a gas mixture that is free of reactive gases during the structuring step.

32. The method according to claim 20, which comprises dry etching the at least one layer with a gas mixture including only inert gases, nitrogen and oxygen during the structuring step.

33. The method according to claim 20, which comprises dry etching the at least one layer with an inert gas during the structuring step.

34. The method according to claim 20, which comprises dry etching the at least one layer with argon gas during the structuring step.

35. The method according to claim 20, which comprises forming the mask from a material selected from the group consisting of silicon, a silicon oxide including silicon dioxide, a metal including aluminum and tungsten, a metal nitride including a titanium nitride, and a metal silicide.

36. The method according to claim 20, which comprises forming the mask from $TiN_x$ where $0.8<x<1.2$.

37. The method according to claim 20, which comprises varying a sound frequency of the sound action over a predetermined frequency ranges.

* * * * *